(12) United States Patent
Agam et al.

(10) Patent No.: US 10,896,954 B2
(45) Date of Patent: Jan. 19, 2021

(54) ELECTRONIC DEVICE INCLUDING A DRIFT REGION

(71) Applicant: Semiconductor Components Industries, LLC, Phoenix, AZ (US)

(72) Inventors: Moshe Agam, Portland, OR (US); Ladislav Šeliga, Francova Lhota (CZ); Thierry Coffi Herve Yao, Portland, OR (US); Jaroslav Pjenčák, Dolní Bečva (CZ); Gary H. Loechelt, Tempe, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/180,819

(22) Filed: Nov. 5, 2018

(65) Prior Publication Data
US 2019/0088554 A1 Mar. 21, 2019

Related U.S. Application Data

(62) Division of application No. 14/837,228, filed on Aug. 27, 2015, now Pat. No. 10,153,213.

(51) Int. Cl.
*H01L 29/76* (2006.01)
*H01L 29/06* (2006.01)
(Continued)

(52) U.S. Cl.
CPC ........ *H01L 29/0634* (2013.01); *H01L 21/761* (2013.01); *H01L 21/823412* (2013.01); *H01L 21/823807* (2013.01); *H01L 29/063* (2013.01); *H01L 29/0653* (2013.01); *H01L 29/1045* (2013.01); *H01L 29/1095* (2013.01); *H01L 29/402* (2013.01); *H01L 29/4175* (2013.01); *H01L 29/41766* (2013.01);
(Continued)

(58) Field of Classification Search
CPC .......... H01L 29/7823; H01L 29/66681; H01L 29/402; H01L 29/0653; H01L 29/1095; H01L 29/063; H01L 21/823412; H01L 21/823807; H01L 21/761; H01L 29/0634
See application file for complete search history.

(56) References Cited

U.S. PATENT DOCUMENTS 5,374,843 A * 12/1994 Williams ............ H01L 29/7816
257/492
6,693,339 B1 2/2004 Khemka et al.
(Continued)

*Primary Examiner* — Shouxiang Hu
(74) *Attorney, Agent, or Firm* — Abel Schillinger, LLP

(57) ABSTRACT

An electronic device can include a semiconductor layer having a primary surface, a drift region adjacent to the primary surface, a drain region adjacent to the drift region and extending deeper into the semiconductor layer as compared to the drift region, a resurf region spaced apart from the primary surface, an insulating layer overlying the drain region, and a contact extending through the insulating layer to the drain region. In an embodiment, the drain region can include a sinker region that allows a bulk breakdown to the resurf region to occur during an overvoltage event where the bulk breakdown occurs outside of the drift region, and in a particular embodiment, away from a shallow trench isolation structure or other sensitive structure.

18 Claims, 8 Drawing Sheets

(51) Int. Cl.

| | | |
|---|---|---|
| H01L 29/78 | (2006.01) | |
| H01L 29/66 | (2006.01) | |
| H01L 29/10 | (2006.01) | |
| H01L 29/40 | (2006.01) | |
| H01L 21/8234 | (2006.01) | |
| H01L 21/761 | (2006.01) | |
| H01L 21/8238 | (2006.01) | |
| H01L 29/417 | (2006.01) | |
| H01L 29/423 | (2006.01) | |
| H01L 29/51 | (2006.01) | |

(52) U.S. Cl.
CPC .. *H01L 29/42376* (2013.01); *H01L 29/66659* (2013.01); *H01L 29/66681* (2013.01); *H01L 29/66696* (2013.01); *H01L 29/7823* (2013.01); *H01L 29/7824* (2013.01); *H01L 29/7835* (2013.01); *H01L 29/513* (2013.01); *H01L 29/518* (2013.01)

(56) References Cited

U.S. PATENT DOCUMENTS

| | | |
|---|---|---|
| 6,979,875 B2 | 12/2005 | Kwon et al. |
| 7,439,584 B2 | 10/2008 | Khemka et al. |
| 7,550,804 B2 | 6/2009 | Khemka et al. |
| 7,868,379 B2 | 1/2011 | Loechelt |
| 8,999,782 B2 | 4/2015 | Loechelt et al. |
| 9,070,562 B2 | 6/2015 | Loechelt et al. |
| 9,299,831 B2 | 3/2016 | Matsuda et al. |
| 2008/0122025 A1 | 5/2008 | Roggenbauer et al. |
| 2010/0327350 A1 | 12/2010 | Loechelt et al. |
| 2011/0073944 A1 | 3/2011 | Tsukihara |
| 2011/0127602 A1 | 6/2011 | Mallikarjunaswamy |
| 2011/0193160 A1 | 8/2011 | Loechelt et al. |
| 2013/0320443 A1 | 12/2013 | Levin et al. |
| 2014/0070315 A1 | 3/2014 | Levy et al. |
| 2014/0252466 A1 | 9/2014 | Loechelt |
| 2014/0264523 A1 | 9/2014 | Loechelt et al. |
| 2014/0264574 A1 | 9/2014 | Loechelt et al. |

\* cited by examiner

ELECTRONIC DEVICE INCLUDING A DRIFT REGION

CROSS-REFERENCE TO RELATED APPLICATION

This application is a divisional of and claims priority under 35 U.S.C. § 120 to U.S. patent application Ser. No. 14/837,228 entitled "Electronic Device Including a Drift Region, A Drain Region, and a Resurf Region and a Process for Forming the Same" by Agam et al., filed Aug. 27, 2015, which is assigned to the current assignee hereof and incorporated herein by reference in its entirety.

FIELD OF THE DISCLOSURE

The present disclosure relates to electronic devices, and processes of forming electronic devices, and more particularly to electronic devices including drift regions and resurf regions, and processes of forming the same.

RELATED ART

A laterally-diffused metal-oxide-semiconductor (LDMOS) transistor can have a channel region and an adjacent drift region lying along a primary surface of a semiconductor layer. During breakdown, damage to an insulating structure, such as a shallow trench isolation structure, or to portions of the transistor structure where on-state current normally flows may cause the LDMOS transistor to have compromised performance or to fail prematurely. Improved performance and longer lifetime of such transistors is desired.

BRIEF DESCRIPTION OF THE DRAWINGS

Embodiments are illustrated by way of example and are not limited in the accompanying figures.

Figure 1:
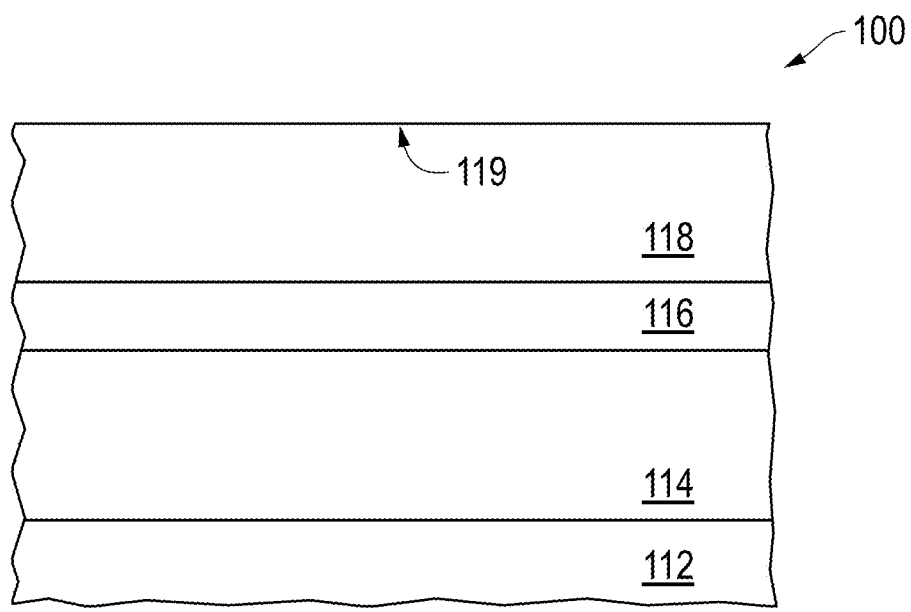
FIG. 1 includes an illustration of a cross-sectional view of a portion of a workpiece including a base material, a lower semiconductor layer, a buried conductive region, and an upper semiconductor layer.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other embodiments can be used based on the teachings as disclosed in this application.

As used herein, the terms "horizontally-oriented" and "vertically-oriented," with respect to a region, member, or structure, refer to the principal direction in which current flows through such region, member or structure. More specifically, current can flow through a region, member, or structure in a vertical direction, a horizontal direction, or a combination of vertical and horizontal directions. If current flows through a region, member, or structure in a vertical direction or in a combination of directions, wherein the vertical component is greater than the horizontal component, such a region, member, or structure will be referred to as vertically oriented. Similarly, if current flows through a region, member, or structure in a horizontal direction or in a combination of directions, wherein the horizontal component is greater than the vertical component, such a region, member, or structure will be referred to as horizontally oriented.

The term "metal" or any of its variants is intended to refer to a material that includes an element that is within any of the Groups 1 to 12, within Groups 13 to 16, an element that is along and below a line defined by atomic numbers 13 (Al), 31 (Ga), 50 (Sn), 51 (Sb), and 84 (Po). Metal does not include Si or Ge.

The term "normal operation" and "normal operating state" refer to conditions under which an electronic component or device is designed to operate. The conditions may be obtained from a data sheet or other information regarding voltages, currents, capacitance, resistance, or other electrical parameters. Thus, normal operation does not include operating an electrical component or device well beyond its design limits.

The term "power transistor" is intended to mean a transistor that is designed to normally operate with at least a 10 V difference maintained between the source and drain or emitter and collector of the transistor when the transistor is in an off-state. For example, when the transistor is in an off-state, a 10 V may be maintained between the source and drain without a junction breakdown or other undesired condition occurring.

The term "semiconductor composition" is intended to refer to the composition of a layer provides the semiconductor characteristics to a layer and does not include dopants. For example, an n-type doped silicon layer and a p-type doped silicon layer have the same semiconductor composition, namely silicon. However, an n-type doped silicon layer and an n-type doped GaN layer have different semiconductor compositions, as silicon and GaN provide the semiconductor characteristics and are different from each other.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one, at least one, or the singular as also including the plural, or vice versa, unless it is clear that it is meant otherwise. For example, when a single item is described herein, more than one item may be used in place of a single item. Similarly, where more than one item is described herein, a single item may be substituted for that more than one item.

Group numbers corresponding to columns within the Periodic Table of Elements based on the IUPAC Periodic Table of Elements, version dated Jan. 21, 2011.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

An electronic device can include a transistor structure that has a drift region and a sinker portion of a drain region that extends to a depth deeper than the drift region. The transistor structure can further include a resurf region. When the drain-to-source breakdown voltage is exceeded, a bulk breakdown between the sinker portion and the resurf region can occur. The location of the highest impact ionization may be below the drift region and away from other relatively sensitive portions of the device, such as a shallow trench isolation structure. Thus, a portion of the transistor structure where on-state current normally flows is not damaged. Further, damage or charge accumulation within a shallow trench isolation structure is less likely. Thus, an electronic device can maintain good performance for a longer time and have a longer operating lifetime. The concepts as described herein are well suited for LDMOS transistor structures.

FIG. 1 includes an illustration of a cross-sectional view of a portion of a workpiece 100 that includes a base material 112, a semiconductor layer 114, a buried conductive region 116, and a semiconductor layer 118 having a primary surface 119. The base material can include a Group 14 element (i.e., carbon, silicon, germanium, or any combination thereof) and can be heavily n-type or p-type doped. For the purposes of this specification, heavily doped is intended to mean a peak dopant concentration of at least approximately $1 \times 10^{19}$ atoms/cm$^3$, and lightly doped is intended to mean a peak dopant concentration of less than approximately $1 \times 10^{19}$ atoms/cm$^3$. The base material 112 can be a portion of a heavily doped substrate (e.g., a heavily n-type doped wafer). In an embodiment, the base material is heavily doped with a p-type dopant, such as boron.

The semiconductor layer 114 is disposed over the base material 112. The semiconductor layer 114 can include a Group 14 element. In an embodiment, the semiconductor layer 114 has a conductivity type opposite the base material 112. In a particular embodiment, the lower semiconductor layer 114 is a lightly doped n-type epitaxial silicon layer. The dopant can be phosphorus, arsenic, antimony, or any combination thereof, and the concentration can be in a range of $1 \times 10^{13}$ atoms/cm$^3$ to $1 \times 10^{16}$ atoms/cm$^3$. The thickness of the semiconductor layer 114 may depend on the designed normal operating voltage of the transistor structure being formed. For example, if a transistor structure has designed normal operating voltage of 70 V, the semiconductor layer 114 may be thicker as compared for a transistor structure having a designed normal operating voltage of 12 V. The thickness of the semiconductor layer 114 can be in a range of approximately 0.2 micron to approximately 15 microns. The semiconductor layer 114 may be disposed over all of the base material 112.

The buried conductive region 116 is heavily doped and has a conductivity type opposite the base material 112. In a particular embodiment, the buried conductive region 116 is a heavily doped n-type epitaxial silicon layer. The dopant can be phosphorus, arsenic, antimony, or any combination thereof, and the concentration can be at least $1 \times 10^{19}$ atoms/cm$^3$. Doping can occur during the epitaxial growth, or a dopant may be introduced into the epitaxial layer after growth. The buried conductive region 116 can have a thickness in a range of 0.2 micron to 5 microns. In the embodiment as illustrated, the buried conductive region 116 can be used as part of a collector for a vertical bipolar transistor (not illustrated) or as part of an interconnecting layer. The buried conductive region 116 may be disposed over all of the workpiece 100 or over only a part of the workpiece 100. In another embodiment, the buried conductive region 116 is not needed and may not be present.

The semiconductor layer 118 is disposed over the buried conductive region 116 and has a primary surface 119 where the transistor structures and other electronic components are subsequently formed. The semiconductor layer 118 can include a Group 14 element and has an opposite conductive type as compared to the buried conductive region 116. In an embodiment, the upper semiconductor layer 118 is a lightly doped p-type epitaxial silicon layer having a thickness in a range of approximately 0.2 micron to approximately 13 microns, and a doping concentration in a range of $1 \times 10^{14}$ atoms/cm$^3$ to $1 \times 10^{17}$ atoms/cm$^3$. The semiconductor layer 118 may be disposed over all of the workpiece 100. The dopant concentration within the semiconductor layer 118 as formed or before selectively doping regions within the semiconductor layer 118 will be referred to as the background dopant concentration.

In an embodiment, the base material 112, the semiconductor layers 114 and 118, and the buried conductive region 116 can have the same semiconductor composition. In a particular embodiment, the base material 112 can be a doped silicon wafer, and the semiconductor layer 114 and 118 and the buried conductive region 116 can be doped silicon layers.

Figure 2:
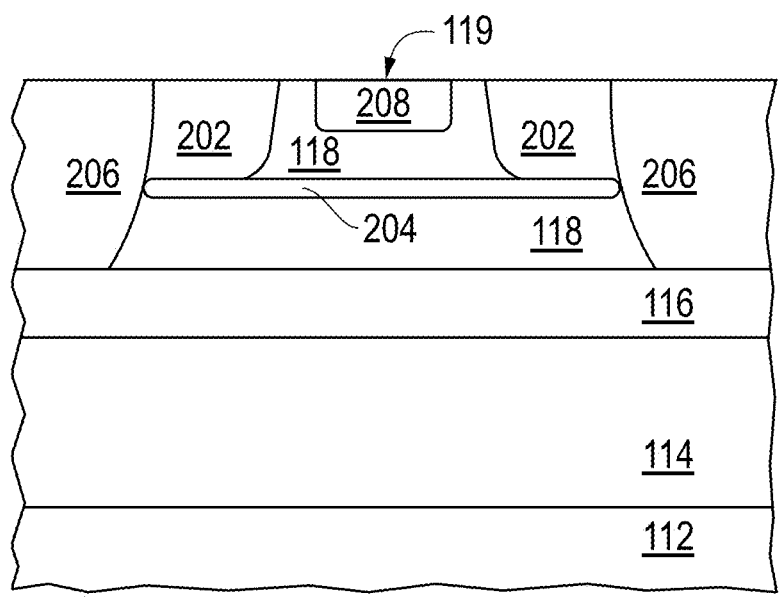
FIG. 2 includes an illustration of a cross-sectional view of the workpiece of FIG. 1 after forming doped regions within the upper semiconductor layer.
Figure 3:
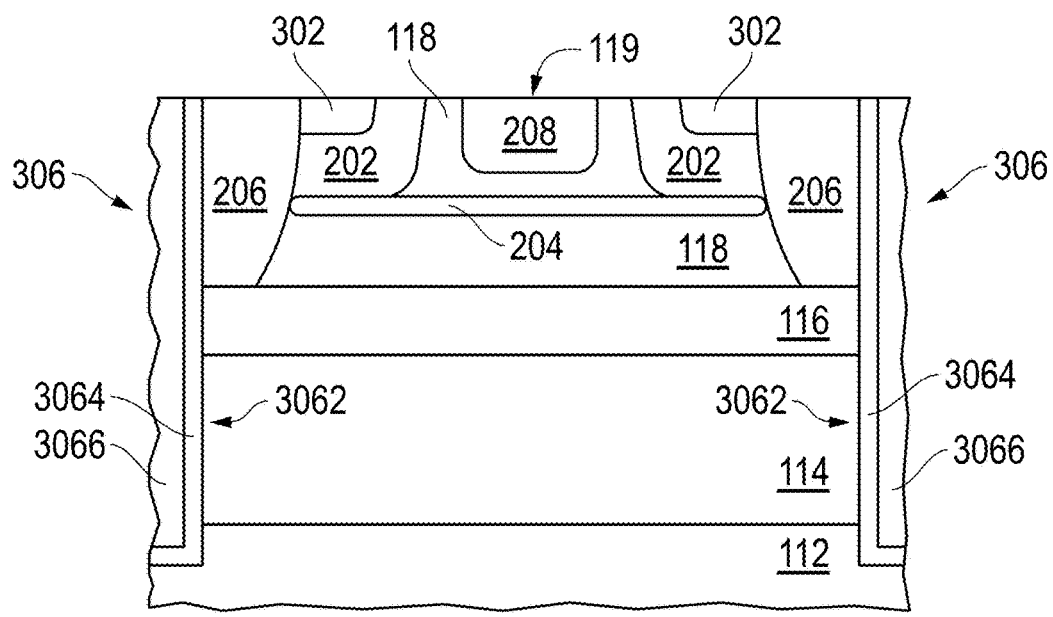
FIG. 3 includes an illustration of a cross-sectional view of the workpiece of FIG. 2 after forming shallow trench isolation structures and deep trench isolation structures.

Many doped regions and other features are formed as illustrated in FIGS. 2 and 3. The order in which the doped regions and other features are described are not necessarily the order in which they are formed. After reading this specification in its entirety, skilled artisans will be able to determine an order regarding formation of the doped regions that meets the desires or needs for a particular application.

FIG. 2 illustrates the workpiece after forming a drift region 202, a resurf region 204, a sinker region 206, and a well region 208. The drift region 202 and the sinker region 206 have the same conductivity type as the buried conductive region 116, and the resurf region 204 has a conductivity type opposite that of the drift, sinker, and buried conductive regions 202, 206, and 116. In the embodiment as illustrated, the transistor structure being formed has an annular structure for the active region. Therefore, FIG. 2 illustrates different portions of the drift region 202 and different portions of the sinker region 206.

The sinker region 206 is formed within the semiconductor layer 118 and extends from the primary surface 119 of the semiconductor layer 118 towards the buried conductive region 116. In the embodiment as illustrated, the sinker region 206 extends to the buried conductive region 116, and in another embodiment, the sinker region 206 extends only partly towards and is spaced apart from the buried conductive region 116. More details regarding the depth of the sinker region 206 will be addressed later in this specification. The sinker region 206 can be moderately to heavily doped. In an embodiment, the sinker region 206 has a concentration in the range of $5 \times 10^{17}$ atoms/cm$^3$ to $1 \times 10^{20}$ atoms/cm$^3$. The concentration may be higher or lower for a particular application. In an embodiment in which a vertical bipolar transistor is also being formed at a different location (not illustrated), the combination of another buried conductive region and another sinker region can be a collector for the bipolar transistor.

The drift region 202 is formed within the semiconductor layer 118 and extends from the primary surface 119 of the semiconductor layer 118 towards the buried conductive region 116. In an embodiment, the drift region 202 may have a depth that is in a range of 1% to 75% of the thickness of the semiconductor layer 118. In terms of values, the drift region 202 can have a depth in a range of 0.2 micron to 5 microns. For example, in an application with a lower designed normal operating voltage (for example, 12 V) and no shallow trench isolation structure within the transistor structure, the depth of the drift region 202 may be in a range of 5% to 30% of the thickness of the semiconductor layer 118 or 0.2 micron to 0.9 micron. In an application with a higher designed normal operating voltage (for example, 70 V) and shallow trench isolation structure within the transistor structure, the depth of the drift region 202 may be in a range of 31% to 75% of the thickness of the semiconductor layer 118 or 1.1 microns to 5 microns.

The drift region 202 can have a light to moderate dopant concentration. In an embodiment, the drift region 202 has a dopant concentration in a range of $1 \times 10^{15}$ atoms/cm$^3$ to $1 \times 10^{18}$ atoms/cm$^3$. In a particular embodiment, the drift region 202 is n-type doped. Further, in an integrated circuit, a well region (not illustrated) can be formed at the same time as the drift region 202 and be used for a digital logic transistor (not a power transistor), a capacitor, a resistor, or another electronic component.

The resurf region 204 is formed within the semiconductor layer 118 and spaced apart from the primary surface 119. A subsequently-formed source region will be formed over the resurf region 204. In a lateral direction, the resurf region 204 may or may not extend completely to the drift region 202, and in a vertical direction, an elevation of a peak dopant concentration of the resurf region 204 is near or below the lowest elevation of the drift region 202. In the embodiment as illustrated, the resurf region 204 abuts the drift region 202 and has a peak concentration at an elevation that is within 0.6 micron of the lowest elevation of the drift region 202.

The well region 208 is formed within the semiconductor layer and extends from the primary surface 119 of the semiconductor layer 118 towards the buried conductive region 116. In an embodiment, the well region 208 is spaced apart from the resurf region 204. In a particular embodiment, the well region 208 can have a depth in a range of 0.2 micron to 4 microns. The well region 208 can have a dopant type opposite that of the drift region 202 and a light to moderate dopant concentration. In an embodiment, the well region 208 has a dopant concentration in a range of $1 \times 10^{15}$ atoms/cm$^3$ to $1 \times 10^{18}$ atoms/cm$^3$. In a particular embodiment, the drift region 202 is p-type doped. Further, in an integrated circuit, another well region (not illustrated) can be formed at the same time as the well region 208 and be used for a digital logic transistor (not a power transistor), a capacitor, a resistor, or another electronic component.

FIG. 3 includes an illustration after forming a shallow trench isolation structure 302 and a deep trench isolation structure are formed. The shallow trench isolation structure 302 extends from the primary surface 119 to a depth in a range of 0.2 micron to 0.9 micron. In a lateral direction, the shallow trench isolation structure 302 extends from the sinker region 206 into the drift region 202, and a portion of the drift region 202 is disposed between the shallow trench isolation structure 302 and the channel region for the transistor structure being formed. The shallow trench isolation structure 302 includes one or more films of oxide, nitride or oxynitride. In an integrated circuit, other shallow trench isolation structures can be used to provide electrical isolation between different electronic components, such as between digital logic transistors.

The deep trench isolation structure 306 is formed within a trench 3062 that extends from the primary surface 119 and into the semiconductor layer 114. In the embodiment as illustrated, the trench 3062 extends through the entire thickness of the semiconductor layer 114 and into the base material 112. In alternative embodiment, the trench 306 may not extend completely to the base material 112. After the trench is formed, one or more insulating films may be formed within the trench 3062. In an embodiment, an insulating film can be formed along the walls and bottom of the trench 3062, and a fill material can be formed to fill a remaining portion of the trench 3062. In the embodiment as illustrated, an oxide layer 3064 can be grown or deposited, and an amorphous or polycrystalline semiconductor film 3066 can fill the remaining portion of the trench 3062. In a particular embodiment, the semiconductor film 3066 is a silicon film when the semiconductor layers 114 and 118 are silicon layers.

The sinker region 206 is a sinker portion of the drain region for the transistor. The drain region will surround the subsequently-formed source region. The combination of the deep trench isolation structure 306 and the outer configuration for the drain region allows the area for the transistor structure to be more than 50% less than a transistor structure where the source region is formed along the outer periphery of the transistor structure and the drain region near the center.

Figure 4:
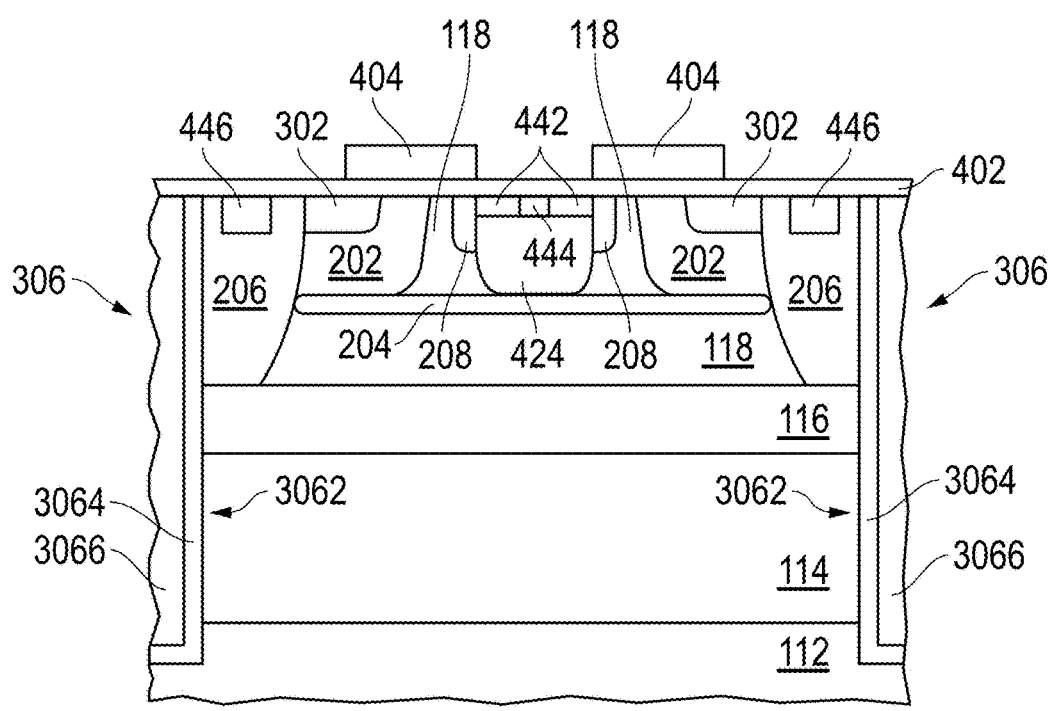
FIG. 4 includes an illustration of a cross-sectional view of the workpiece of FIG. 3 after forming a gate dielectric layer, a gate electrode, a drain contact region, a source region, and a body contact region.

FIG. 4 includes an illustration after forming a gate dielectric layer 402, a gate electrode 404, and doped regions that will be described in more detail below. The gate dielectric layer 402 can include one or more films of oxide, nitride, or oxynitride. The gate dielectric layer has a thickness in a range of 2 nm to 15 nm for many applications. The gate dielectric layer can be formed by thermal growth or deposition.

The gate electrode 404 is formed by depositing a conductive layer and patterning the conductive layer to achieve the pattern as illustrated in FIG. 4. In the embodiment as illustrated, the gate electrode 404 overlies part of the shallow trench isolation structure 302 to allow for depletion of charge carriers within the drift region 202 under the shallow trench isolation structure 302.

The conductive layer can include a semiconductor layer that may be doped in situ or subsequently doped after the layer is deposited. In another embodiment, the conductive layer can include a metal. In still another embodiment, the conductive layer can include a lower film closer to the gate dielectric layer 402 that has a desired work function and an upper film having a different composition that is used for bulk conduction. The conductive layer can have a thickness in a range of 50 nm to 500 nm. Other thicknesses may be used if desired or needed for a particular application. A masking layer (not illustrated) is formed and includes a masking layer member corresponding to the planar shape of the gate electrode 404. An etch is performed to remove exposed portions of the conductive layer to leave the gate electrode 404. Further, in an integrated circuit, another patterned conductive member (not illustrated) can be formed at the same time as the gate electrode 404 and be used for a digital logic transistor (not a power transistor), a capacitor electrode, a resistor, or another electronic component. The masking layer is then removed.

A resurf extension region 424 is formed within the semiconductor layer 118. The resurf extension region 424 allows a connection to be made between the resurf region 204 and a subsequently-formed surface contact. The resurf extension region 424 extends from the primary surface 119 of the semiconductor layer 118 towards the buried conductive region 116 and extends to the resurf region 204. In a particular embodiment, the resurf extension region 424 can have a depth in a range of 0.2 micron to 5 microns. The resurf extension region 424 can have a dopant type that the same as the resurf region 204 and a light to moderate dopant concentration. In a particular embodiment, the resurf extension region 424 has a dopant concentration that is between the dopant concentration of the resurf region 204 and the well region 208. In an embodiment, the resurf extension region 424 has a dopant concentration in a range of $1\times10^{15}$ atoms/cm$^3$ to $1\times10^{18}$ atoms/cm$^3$. In a particular embodiment, the resurf extension region 424 is p-type doped.

A source region 442 and a drain contact region 446 are formed and allow ohmic contacts to be made to subsequently-formed conductive plugs or interconnects. The source region 442 and the drain contact region 446 are relatively shallow and lie along the primary surface 119 of the semiconductor layer 118. In a particular embodiment, the source region 442 and a drain contact region 446 can have a depth in a range of 0.05 micron to 0.5 micron. The source region 442 and the drain contact region 446 can have a dopant type that is the same as the sinker region 206. In an embodiment, the source region 442 and the drain contact region 446 have a dopant concentration in a range of at least $1\times10^{19}$ atoms/cm$^3$. In a particular embodiment, the source region 442 and the drain contact region 446 are n-type doped. Further, in an integrated circuit, another heavily doped region (not illustrated) having the same conductivity type as the source region 442 and the drain contact region 446 can be formed at the same time as the source region 442 and the drain contact region 446 and be used for a digital logic transistor (not a power transistor), a capacitor electrode, a contact region for a resistor, or another electronic component.

A body contact region 444 is formed. The body contact region 444 allows an ohmic contact to be made subsequently-formed conductive plugs or interconnects. The body contact region 444 is relatively shallow and lies along the primary surface 119 of the semiconductor layer 118. In a particular embodiment, the body contact region 444 can have a depth in a range of 0.05 micron to 0.5 micron. The body contact region 444 can have a dopant type that is the same as the well region 208. In an embodiment, the body contact region 444 has a dopant concentration of at least $1\times10^{19}$ atoms/cm$^3$. In a particular embodiment, the body contact region 444 is p-type doped. Further, in an integrated circuit, another heavily doped region (not illustrated) having the same conductivity type as the body contact region 444 can be formed at the same time as the body contact region 444 and be used for a digital logic transistor (not a power transistor), a capacitor electrode, a contact region for a resistor, or another electronic component.

Figure 5:
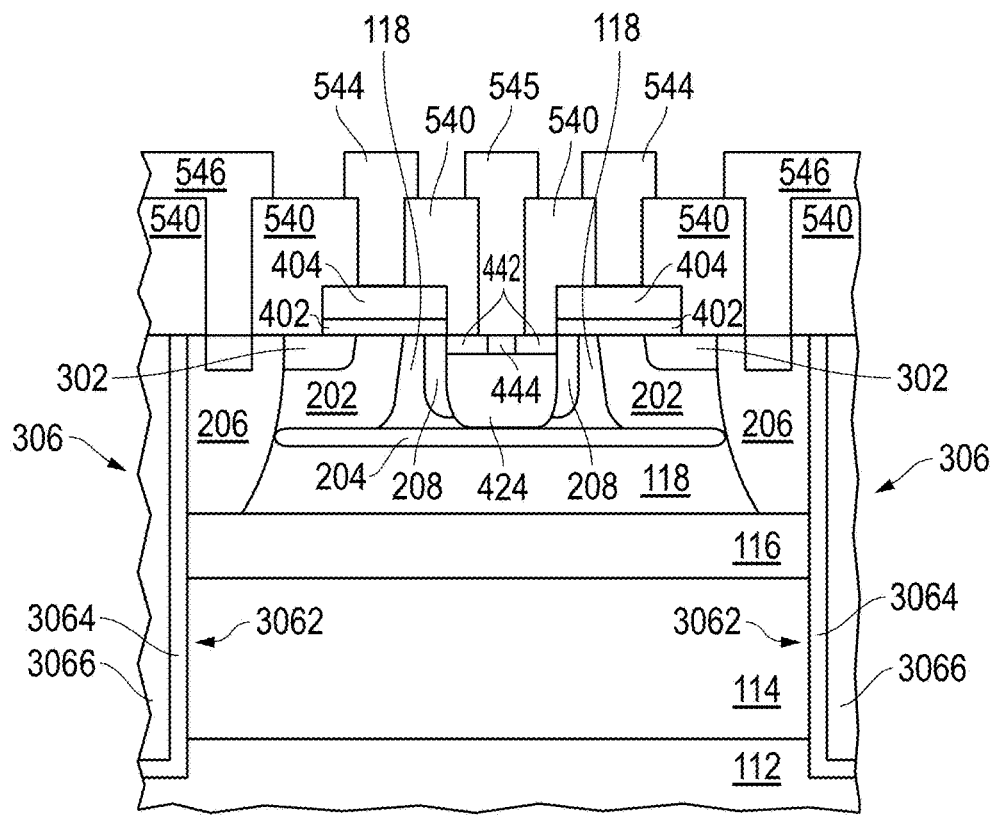
FIG. 5 includes an illustration of a cross-sectional view of the workpiece of FIG. 4 after forming a substantially completed electronic device.

FIG. 5 includes an illustration of the workpiece after forming an interlevel dielectric (ILD) layer 540 and interconnects 544, 545, and 546. The ILD layer 540 is formed over the workpiece and can include an oxide, a nitride, an oxynitride, an organic dielectric, or any combination thereof. The ILD layer 540 can include a single film having a substantially constant or changing composition (e.g., a high phosphorus content further from the semiconductor layer 118) or a plurality of discrete films. An etch-stop film, an antireflective film, or a combination may be used within or over the ILD layer 540 to help with processing. The ILD layer 540 can be deposited to a thickness in a range of approximately 0.5 micron to approximately 2.0 microns. In the embodiment, the ILD layer 540 may or may not be planarized. A masking layer (not illustrated) is formed over the workpiece and defines openings under which openings in the ILD layer 540 will be subsequently formed. Exposed portions of the ILD layer 540 are etched to define the openings in which the interconnects 544, 545, and 546 will be subsequently formed. The masking layer is then removed.

Interconnects 544, 545, and 546 are formed within the openings in the ILD layer 540. As illustrated, the interconnects 544 are electrically connected to the gate electrode 404, the interconnect 545 is electrically connected to the source region 442 and the body contact region 444, and the drain interconnects 546 are electrically connected to the drain contact regions 446. If the sinker region 206 has a sufficient dopant concentration to form an ohmic contact with the interconnects 546, the drain contact region 446 is not required. Other interconnects are formed that make electrical contact at other locations for the transistor structure illustrated. Although the interconnects 544, 545, and 546 are illustrated as being side-by-side to simplify understanding of the transistor structure, the interconnects may be offset in a lateral direction to allow for a smaller area of the transistor structure, to reduce capacitive coupling between the interconnects, or the like.

The interconnects 544, 545, and 546 can be formed using a conductive layer that includes one or more films of a metal-containing material. In an embodiment, the conductive layer includes a plurality of films, such as an adhesion film, a barrier film, and a conductive bulk film. In a particular embodiment, the adhesion film can include a refractory metal, such as titanium, tantalum, tungsten, or the like; the barrier film can include a refractory metal nitride, such as titanium nitride, tantalum nitride, tungsten nitride, or the like, or a refractory metal-semiconductor-nitride, such as TaSiN; and the conductive bulk film can include at least 90 wt % of Al, Cu, or the like. In a more particular embodiment, the conductive layer can include Ti/TiN/Al with less than 2 wt % each of Cu and Si. In an integrated circuit, other interconnects (not illustrated) can be formed at the same time as the interconnects 544, 545, and 546 and be used for electrical connections to a digital logic transistor (not a power transistor), a capacitor electrode, a resistor, or another electronic component.

Although not illustrated, additional or fewer layers or features may be used as needed or desired to form the electronic device. In another embodiment, more insulating and interconnect levels may be used. A passivation layer can be formed over the workpiece or within the interconnect levels. After reading this specification, skilled artisans will be able to determine layers and features for their particular application.

The electronic device can include many other transistor structures that are substantially identical to the transistor structure as illustrated in FIG. 5. The transistor structures can be connected in parallel to each other to form the transistor. Such a configuration can give a sufficient effective channel width of the electronic device that can support the relatively high current flow that is used during normal operation of the electronic device.

Figure 6:
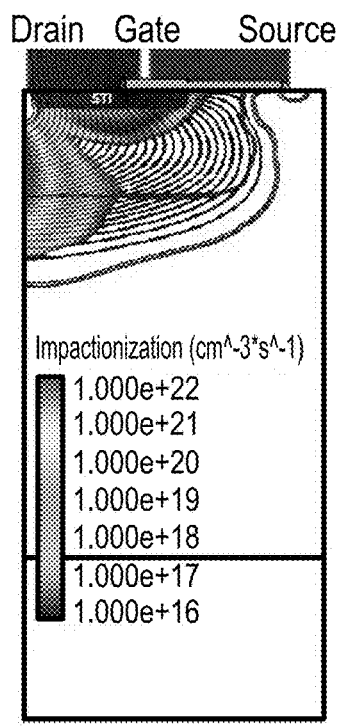
FIG. 6 includes a simulation of a bulk breakdown of a comparative device.

After the drain-to-source breakdown voltage ($BV_{DS}$) is exceeded for the embodiment as illustrated, the impact ionization is less likely to cause irreversible or pre-mature damage to occur within the transistor structure. To understand better the improvement, a comparative transistor structure is addressed first. The comparative transistor structure has a drain contact region to the drift region but does not have a sinker region. The comparative transistor has a $BV_{DS}$ of about 80 V. FIG. 6 includes an illustration of the simulation of impact ionization for the comparative transistor structure when a voltage difference between the drain and each of the source and gate exceeds $BV_{DS}$. The highest impact ionization occurs within the drift region just below the drain region and adjacent to the shallow trench isolation structure. The electrical field is oriented principally in a vertical direction.

Figure 7:
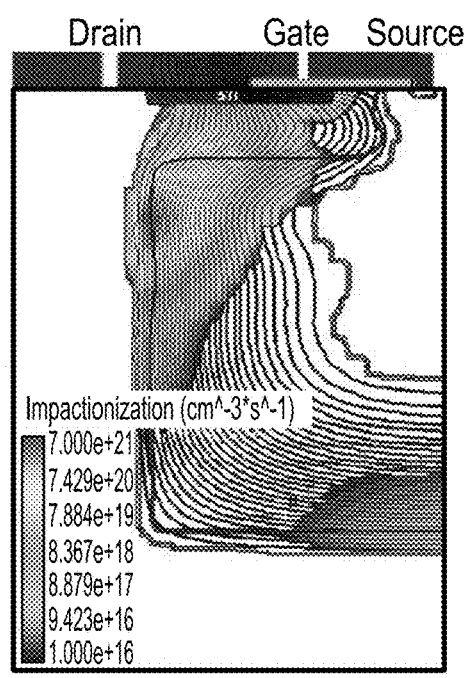
FIG. 7 includes a simulation of a bulk breakdown of the electronic device as illustrated in FIG. 5.

The sinker region 206 allows the transistor structure as illustrated in FIG. 5 to have a $BV_{DS}$ of at least 100 V. FIG. 7 includes an illustration of the simulation of impact ionization for the transistor structure when a voltage difference between the drain and each of the source and gate exceeds $BV_{DS}$. The highest impact ionization occurs just below the drift region 202. The electrical field is principally in a lateral direction between the sinker region 206 and the resurf region 204. Thus, the highest impact ionization is spaced apart from where current normally flows when the transistor structure is on. Thus, in the embodiment illustrated, on-current does not flow through semiconductor material (e.g., silicon) that may have been previously damaged during an over-voltage event. Furthermore, the shallow trench isolation structure is farther from the highest impact ionization and less likely to be damaged when $BV_{DS}$ is exceeded.

Furthermore, as previously addressed, the cell size of the transistor can be decreased by over 50% as compared to a similar transistor structure that has a drain region in the center and a source region surrounding the drain region.

FIGS. 8 to 17 illustrate an exemplary process of forming different transistor structures. The transistor structure illustrated in FIG. 5 may be useful for a relatively higher voltage, low current applications. The transistor structures described with respect to FIGS. 8 to 17 may be useful for relatively lower voltages (for example 10 V to 15 V) and high current, such as for a high-frequency energy converter. Thus, the concepts as described herein can be used for a variety of different LDMOS transistor structures.

Figure 8:
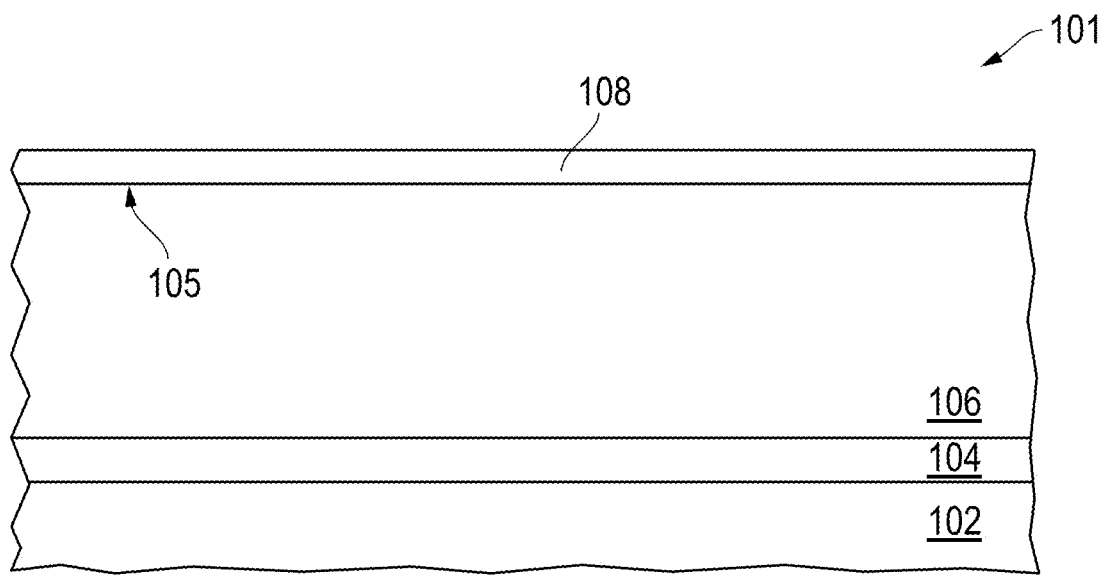
FIG. 8 includes an illustration of a cross-sectional view of a portion of a workpiece including a buried conductive region, a buried insulating layer, a semiconductor layer, and a dielectric layer.

FIG. 8 includes an illustration of a cross-sectional view of a portion of a workpiece 101 that includes a buried conductive region 102, a buried insulating layer 104, a semiconductor layer 106, and a dielectric layer 108. The buried conductive region 102 can include a Group 14 element (i.e., carbon, silicon, germanium, or any combination thereof) and can be heavily n-type or p-type doped. For the purposes of this specification, heavily doped is intended to mean a peak dopant concentration of at least approximately $1 \times 10^{19}$ atoms/cm$^3$, and lightly doped is intended to mean a peak dopant concentration of less than approximately $1 \times 10^{19}$ atoms/cm$^3$. The buried conductive region 102 can be a portion of a heavily doped substrate (e.g., a heavily n-type doped wafer) or may be a buried doped region disposed over a substrate of opposite conductivity type or over another buried insulating layer (not illustrated) that is disposed between a substrate and the buried conductive region 102. In an embodiment, the buried conductive region 102 is heavily doped with an n-type dopant, such as phosphorus, arsenic, antimony, or any combination thereof. In a particular embodiment, the buried conductive region 102 includes arsenic or antimony if diffusion of the buried conductive region 102 is to be kept low, and in a particular embodiment, the buried conductive region 102 includes antimony to reduce the level of autodoping (as compared to arsenic) during formation of a subsequently-formed semiconductor layer.

The buried insulating layer 104 is disposed over the buried conductive region 102. During normal operation, the buried insulating layer 104 helps to isolate the voltage on the buried conductive region 102 from portions of the semiconductor layer 106. The buried insulating layer 104 can include an oxide, a nitride, or an oxynitride. The buried insulating layer 104 can include a single film or a plurality of films having the same or different compositions. The buried insulating layer 104 can have a thickness in a range of at least approximately 0.2 micron or at least approximately 0.3 micron. Further, the buried insulating layer 104 may have a thickness no greater than approximately 5.0 microns or no greater than approximately 2.0 microns. In a particular embodiment, the buried insulating layer 104 has a thickness in a range of approximately 0.5 micron to approximately 0.9 micron. The buried insulating layer 104 is not required, and in another embodiment, the semiconductor layer 106 can be formed on the buried conductive region 102.

The semiconductor layer 106 is disposed over the buried insulating layer 104 and has a primary surface 105 where the transistors and other electronic components (not illustrated) are formed. The semiconductor layer 106 can include a Group 14 element and any of the dopants as described with respect to the buried conductive region 102 or dopants of the opposite conductivity type. In an embodiment, the semiconductor layer 106 is a lightly doped n-type or p-type epitaxial silicon layer having a thickness in a range of approximately 0.2 micron to approximately 5.0 microns, and a doping concentration no greater than approximately $1 \times 10^{17}$ atoms/cm$^3$, and in another embodiment, a doping concentration of at least approximately $1 \times 10^{14}$ atoms/cm$^3$. The dopant concentration within the semiconductor layer 106 as formed or before selectively doping regions within the semiconductor layer 106 will be referred to as the background dopant concentration.

The dielectric layer 108 can be formed over the semiconductor layer 106 using a thermal growth technique, a deposition technique, or a combination thereof. The dielectric layer 108 can include an oxide, a nitride, an oxynitride, or any combination thereof. In an embodiment, the dielectric layer 108 includes an oxide and has a thickness in a range of approximately 11 nm to approximately 50 nm.

Figure 9:
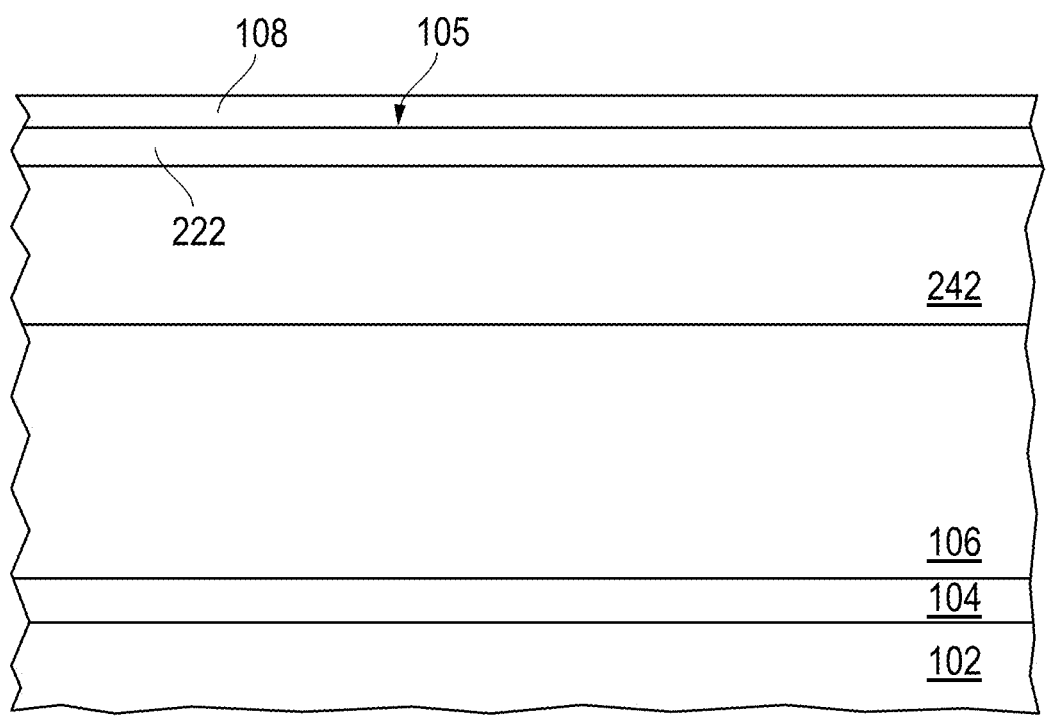
FIG. 9 includes an illustration of a cross-sectional view of the workpiece of FIG. 8 after forming a drift doped region and a resurf region.

FIG. 9 illustrates the workpiece after forming drift and resurf regions 222 and 242. The drift regions 222 can have a dopant concentration of less than approximately $1 \times 10^{19}$ atoms/cm$^3$ and at least approximately $1 \times 10^{16}$ atoms/cm$^3$ and a depth in one embodiment of less than approximately 0.9 micron, and in another embodiment of less than approximately 0.5 micron. In a particular embodiment, the drift regions 222 are n-type doped.

The resurf regions 242 can help keep more current flowing through the drift regions 222 instead of into the semiconductor layer 106 underlying the drift regions 222. The resurf regions 242 may have a dopant concentration of no greater than approximately $5 \times 10^{17}$ atoms/cm$^3$ and at least approximately $1 \times 10^{16}$ atoms/cm$^3$, and a depth in one embodiment of less than approximately 1.5 microns, and in another embodiment of less than approximately 1.2 microns. The peak concentration of the resurf regions 242 may be in a range of approximately 0.5 micron to approximately 0.9 micron below the primary surface 105. In a particular embodiment, the resurf regions 242 are p-type doped.

In an embodiment, the drift regions 222 can be formed before the resurf regions 242. In another embodiment, the drift regions 222 can be formed after the resurf regions 242.

Figure 10:
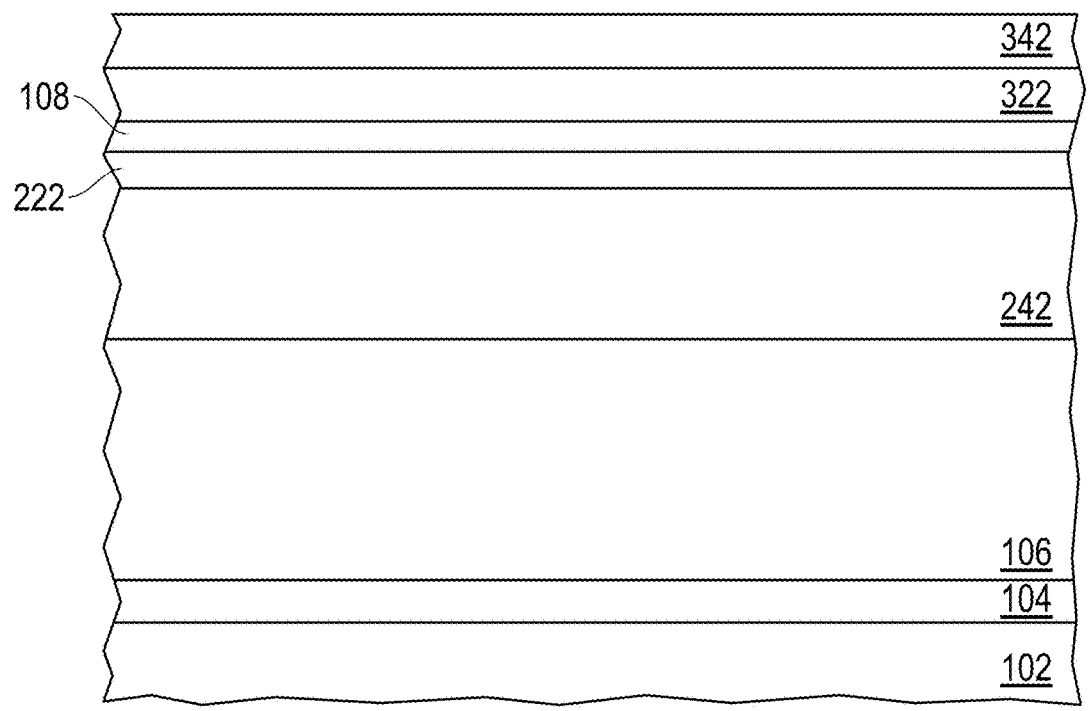
FIG. 10 includes an illustration of a cross-sectional view of the workpiece of FIG. 9 after forming an insulating layer and a conductive layer.

FIG. 10 includes an illustration after forming an insulating layer 322 and a conductive layer 342. The insulating layer 322 can be formed using a thermal growth technique, a deposition technique, or a combination thereof. The insulating layer 322 can include an oxide, a nitride, an oxynitride, or any combination thereof. In an embodiment, the insulating layer 322 includes a nitride and has a thickness in a range of approximately 20 nm to approximately 90 nm. The conductive layer 342 is deposited over the insulating layer 322. The conductive layer 342 includes a conductive material or may be made conductive, for example, by doping. More particularly, the conductive layer 342 can include a doped semiconductor material (e.g., heavily doped amorphous silicon, polysilicon, etc.). The conductive layer 342 has a thickness in a range of approximately 0.05 micron to approximately 0.5 micron.

Figure 11:
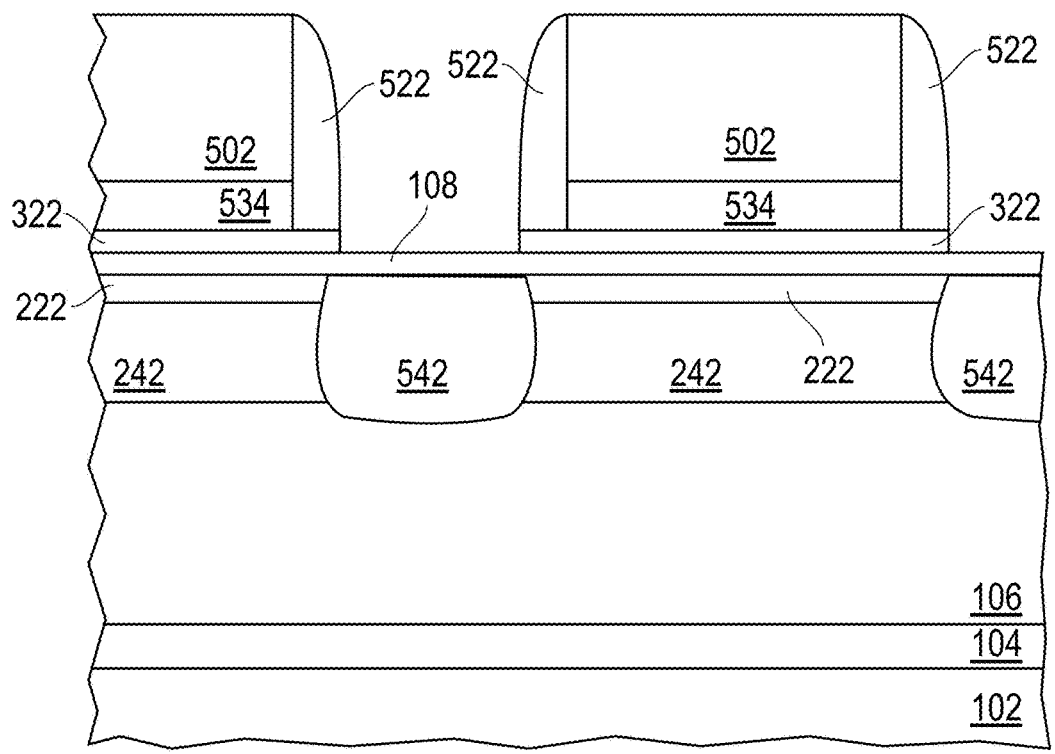
FIG. 11 includes an illustration of a cross-sectional view of the workpiece of FIG. 10 after forming insulating members, patterning the conductive layer to form conductive electrode members, insulating sidewall spacers, and deep body doped regions.

FIG. 11 includes an illustration after forming an insulating layer 502, patterning the insulating layer 502, patterning the conductive layer 342 to form conductive electrode members 534, forming insulating spacers 522 and deep body doped regions 542. The insulating layer 502 can include one or more insulating layers. In the embodiment as illustrated in FIG. 11, an insulating layer 502 is deposited over the conductive layer 342. The insulating layer 502 can include an oxide, a nitride, an oxynitride, or an organic dielectric. The insulating layer 502 has a thickness in a range of approximately 0.2 micron to approximately 2.0 microns.

A masking layer (not illustrated) is formed over the insulating layer 502 and patterned to define an opening where the transistor is being formed. Portions of the conductive layer 342 are patterned, and the masking features are removed. Remaining portions of the conductive layer 342 are conductive electrode members 534 that can help to reduce drain-to-gate capacitance in the transistor. In a particular embodiment, the conductive electrode members 534 are horizontally-oriented semiconductor members. The insulating spacers 522 are formed along the sidewalls of the conductive electrode members 534 and the insulating layer 502. In a particular embodiment, the insulating spacers 522 include a nitride and are formed by depositing a nitride layer to a thickness in a range of approximately 20 nm to approximately 90 nm and anisotropically etching the nitride layer to form the insulating spacers 522. Openings defined by the insulating spacers 522 are disposed over portions of the semiconductor layer 106 where deep body doped regions 542 and source and channel regions will be formed.

The deep body doped regions 542 can provide alternative paths during avalanche breakdown between the drain region of the transistor and the deep body doped regions 542 as opposed to avalanche breakdown between the drain region and a subsequently-formed channel region. Thus, if avalanche breakdown involving the drain region would occur, current flows through the deep body doped regions 542 in preference to the channel region. Therefore, the channel region is less likely to be permanently altered if avalanche breakdown occurs. The depths and concentrations of the deep body doped regions 542 may be related to the depths and concentrations of the channel region.

In an embodiment, the peak concentration of the deep body doped regions 542 is at least approximately 0.1 micron deeper than the peak concentration of the channel region, and in another embodiment, the peak concentration of the deep body doped regions 542 is no greater than approximately 0.9 micron deeper than the peak concentration of the channel region. In a further embodiment, the peak concentration of the deep body doped regions 542 is in a range of approximately 0.6 micron to approximately 1.1 microns below the primary surface 105. The deep body doped regions 542 can be formed using a single implant or a combination of implants. The deep body doped regions 542 may or may not contact the buried insulating layer 104. For (1) a single implant or (2) an implant of a combination of implants having the lowest projected range, the dose can be in a range of approximately $5 \times 10^{13}$ ions/cm$^2$ to approximately $5 \times 10^{14}$ ions/cm$^2$.

Figure 12:
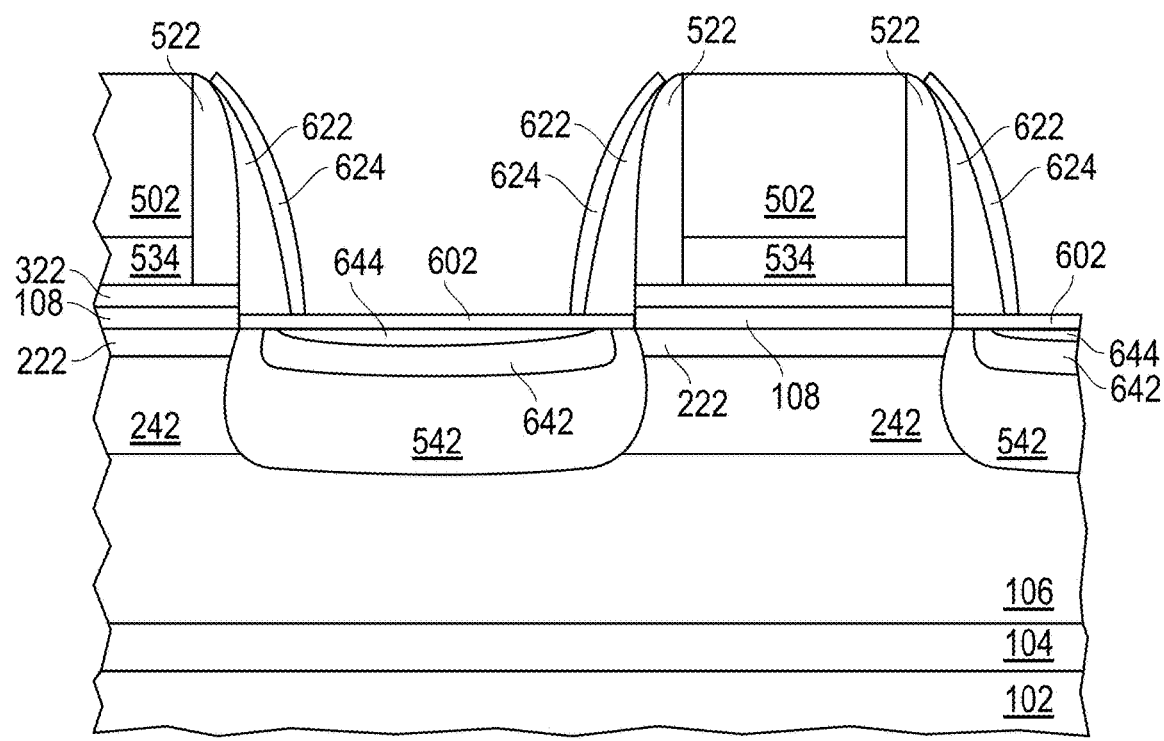
FIG. 12 includes an illustration of a cross-sectional view of the workpiece of FIG. 11 after forming body regions, gate electrodes, an insulating layer, and source regions.

FIG. 12 includes an illustration of the workpiece after forming a gate dielectric layer 602, gate electrodes 622, an insulating layer 624 along exposed surfaces of the gate electrodes 622, body regions 642, and source regions 644. The body regions 642 may include channel regions for the transistor. The body regions 642 can reduce the likelihood of punchthrough between the source and drain of the transistor structures. The body regions 642 have the same conductivity type as the channel region and the deep body doped regions 542 and can have a peak dopant concentration of at least approximately $1 \times 10^{18}$ atoms/cm$^3$. In another embodiment, not illustrated, a channel region for the transistor may be formed separately, and in such an embodiment, the body regions 642 reduce the likelihood of having more resistive regions between the channel region and the deep body doped regions 542, as compared to not having the body regions 642. Such body regions 642 can be formed by ion implantation with a dose in a range of approximately $5 \times 10^{12}$ ions/cm$^2$ to approximately $5 \times 10^{13}$ ions/cm$^2$. The energy can be selected to achieve a projected range of approximately 0.05 micron to approximately 0.3 micron. In another embodiment, one or more implants can be used to tailor the dopant concentrations and profiles under or spaced apart from the gate electrodes 622 to achieve a desire threshold voltage, channel-to-drain breakdown voltage, or another electrical characteristic. After reading this specification, skilled artisans will be able to determine dopant steps, doses, and projected ranges to achieve proper dopant concentrations and locations of doped regions for a particular application.

The exposed portions of the dielectric layer 108 are removed by etching, and the gate dielectric layer 602 is formed over the exposed surface along the bottoms of the openings. In a particular embodiment, the gate dielectric layer 602 includes an oxide, a nitride, an oxynitride, or any combination thereof and has a thickness in a range of approximately 5 nm to approximately 50 nm. The gate electrodes 622 are disposed over the gate dielectric layer 602 and are spaced apart and electrically isolated from the conductive electrode members 534. The gate electrodes 622 can be formed by depositing a layer of material that is conductive as deposited or can be subsequently made conductive. The layer of material can include a metal-containing or semiconductor-containing material. In an embodiment, the layer is deposited to a thickness of approximately 0.1 micron to approximately 0.5 micron. The layer of material is etched to form the gate electrodes 622. In the illustrated embodiment, the gate electrodes 622 are formed without using a mask and have shapes of sidewall spacers. The widths of the gate electrodes 622 at their bases are substantially the same as the thickness of the layer as deposited.

The insulating layer 624 can be thermally grown from the gate electrodes 622 or may be deposited over the workpiece. The thickness of the insulating layer 624 can be in a range of approximately 10 nm to approximately 30 nm. The source regions 644 are formed from portions of the body regions 642. The source regions 644 can include extension portions and a heavily doped portion. The extension portions can have a dopant concentration higher than approximately $5 \times 10^{17}$ atoms/cm$^3$ and less than approximately $5 \times 10^{19}$ atoms/cm$^3$. If needed or desired, an additional set of insulating spacers (not illustrated) may be formed before forming the heavily doped portions of the source regions 644. Such insulating spacers are formed to cover parts of the extension portions of the source regions 644 and to displace the heavily doped portions further from the gate electrodes 622. The insulating spacers can be formed by depositing an insulating layer and anisotropically etching the insulating layer. The insulating spacers can include an oxide, a nitride, an oxynitride, or any combination thereof, and have widths at the bases of the insulating spacers in a range of approximately 50 nm to approximately 200 nm.

The doping for the heavily doped portions of the source regions 644 can be performed after the insulating layer 624 is formed. The heavily doped portions of the source regions 644 allows ohmic contacts to be subsequently made and have a dopant concentration of at least approximately $1 \times 10^{19}$ atoms/cm$^3$. The source regions 644 can be formed using ion implantation, have an opposite conductivity type as compared to the body regions 642, and the same conductivity type as the drift regions 222 and the buried conductive region 102.

Figure 13:
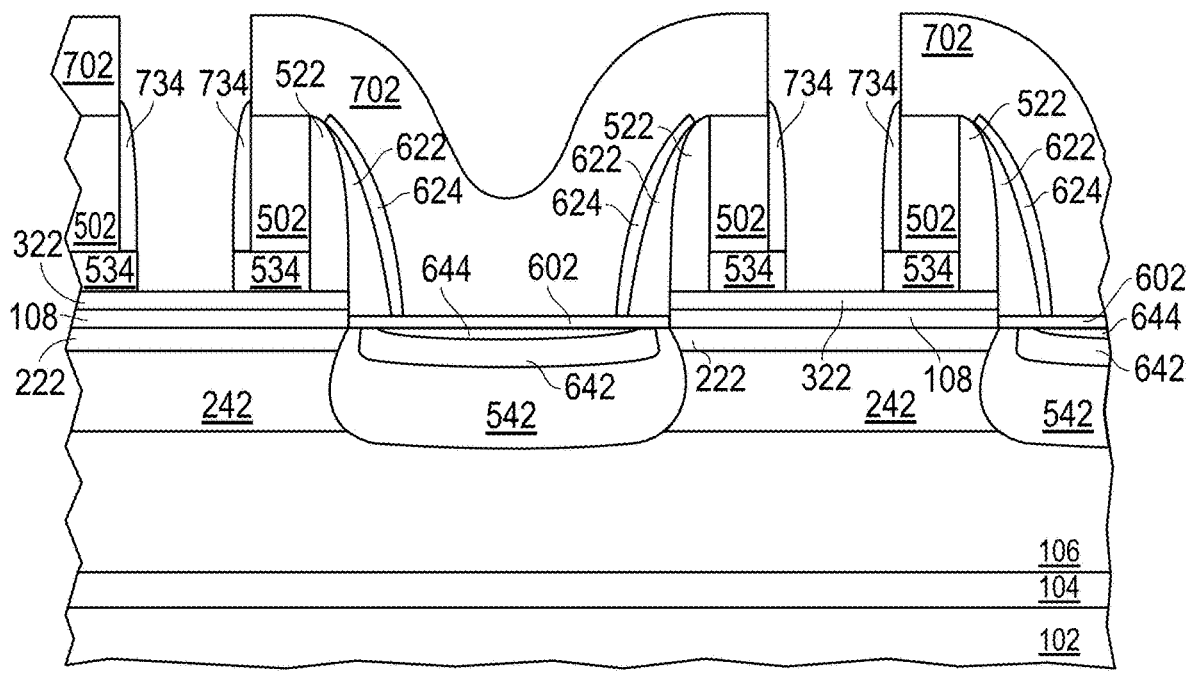
FIG. 13 includes an illustration of a cross-sectional view of the workpiece of FIG. 12 after forming a patterned interlevel dielectric layer and forming conductive electrode members within openings defined by the patterned interlevel dielectric layer.

FIG. 13 includes an illustration of the workpiece after forming an interlevel dielectric (ILD) layer 702 and the conductive electrode members 734. The ILD layer 702 is formed over the workpiece and can include an oxide, a nitride, an oxynitride, an organic dielectric, or any combination thereof. The ILD layer 702 can include a single film having a substantially constant or changing composition (e.g., a high phosphorus content further from the semiconductor layer 106) or a plurality of discrete films. An etch-stop film, an antireflective film, or a combination may be used within or over the ILD layer 702 to help with processing. The ILD layer 702 can be deposited to a thickness in a range of approximately 0.5 micron to approximately 2.0 microns. In the embodiment as illustrated in FIG. 13, the ILD layer 702 is not planarized. In another embodiment, the ILD layer 702 may be planarized if needed or desired. A patterned masking layer (not illustrated) is formed over the workpiece and defines openings under which openings in the ILD layer 702 will be subsequently formed. Exposed portions of the ILD layer 702 are etched to define the openings in which the conductive electrode members 734 will be subsequently formed. Etching may be continued to etch through the conductive electrode members 534. The patterned masking layer can be removed at this time.

The conductive electrode members 734 are formed along the sidewalls of the openings as illustrated in FIG. 13. The conductive electrode members 734 can have the same conductivity type as the conductive electrode members 534. The conductive electrode members 734 can include a doped semiconductor material (e.g., heavily doped amorphous silicon, polysilicon, etc.), a metal-containing material (a refractory metal, a refractory metal nitride, a refractory metal silicide, etc.), or any combination thereof.

When forming the conductive electrode members 734, the layer fills only part, and not all, of the openings and can have a thickness in a range of approximately 50 nm to approximately 400 nm. If the layer has not been doped, it may be used at this time. If ion implantation is used, the ion implant may be performed using a tilt angle to incorporate some of the dopant along the vertical or steeper portions of the layer. In a particular embodiment, the tilt angle may be in a range of 5° to 20°. The workpiece may be rotated during different parts of the implantation to ensure better that all surfaces of the conductive electrode members 734 are doped. The layer is anisotropically etched to remove portions of the layer overlying the ILD layer 702. The etch can be continued to recess the uppermost points of the conductive electrode members 734 within the openings. Any exposed portion of conductive electrode members 534 remaining within the openings may also be removed at this time.

Some features of the electronic device at this point in the process are noteworthy. The conductive electrode members 534 and 734 abut each other. In the embodiment as illustrated, each pair of the conductive electrode members 534 and 734 is substantially L-shaped. As illustrated in FIG. 13, the conductive electrode members 734 lie closer to particular ends of the conductive electrode members 534, and the gate electrodes 622 lie closer to opposite ends of the conductive electrode members 534. Thus, the gate electrodes 622 are closer to the conductive electrode members 534 than to the conductive electrode members 734. Thus, capacitive coupling between the gate electrodes 622 and the conductive electrodes can be reduced, as compared to having the conductive electrode members 734 along both ends of the conductive electrode members 534. As compared to distal ends of the conductive electrode members 734, proximal ends of the conductive electrode members 734 are closer to the semiconductor layer 106 and the conductive electrode members 534. Subsequently-formed contact openings will extend to the conductive electrode members 734, and in an embodiment, no contact openings will extend to the conductive electrode members 534.

Figure 14:
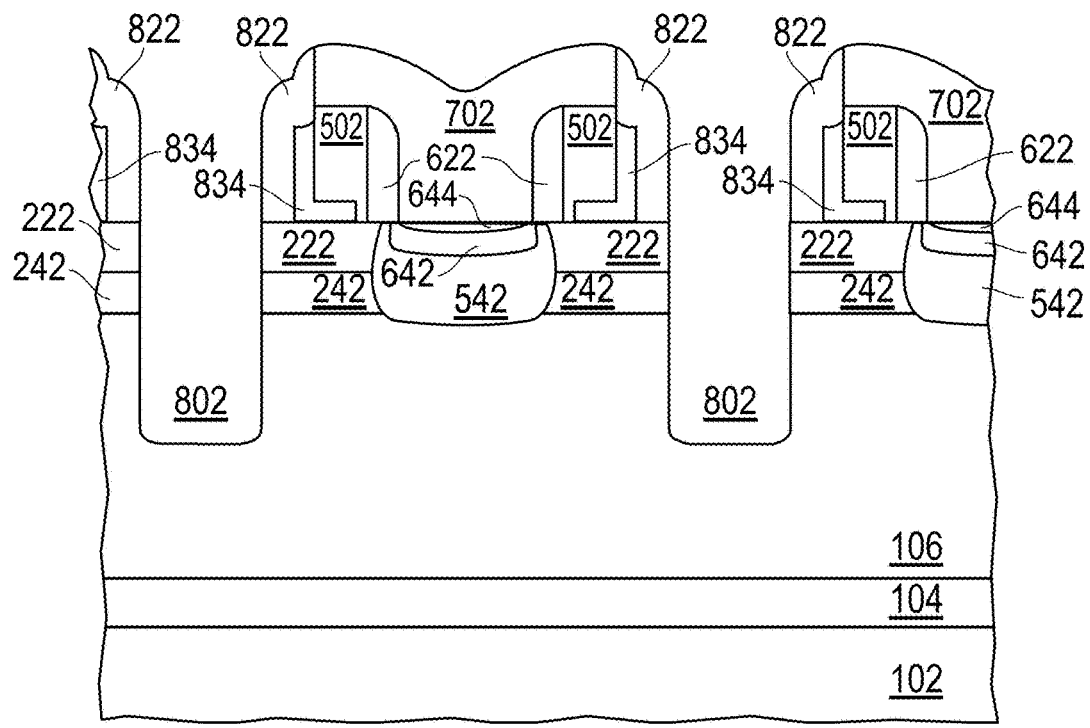
FIG. 14 includes an illustration of a cross-sectional view of the workpiece of FIG. 13 after forming insulating spacers and trenches extending into the semiconductor layer.

FIG. 14 includes an illustration of the workpiece after forming insulating spacers 822 and trenches 802. In the FIG. 14 and the remaining figures, the combinations of conductive electrode members 534 and 734 are referred to as conductive electrodes 834. Further, some of the features seen in FIG. 13 are present but not illustrated in FIGS. 14 to 17 to simplify understanding of the concepts described herein. For example, the dielectric layer 108 and insulating layer 322 (in FIG. 13) lie between the conductive electrodes 834 and the drift regions 222 but are not illustrated in FIGS. 14 to 17. Similarly, the gate dielectric layer 602 is present but is not illustrated in FIGS. 14 to 17. Furthermore, the combinations of portions of the insulating layer 502 and insulating spacers 522 are present in FIGS. 14 to 17 and are designated with reference number 502.

The insulating spacers 822 can be formed using any of the materials and formation techniques as previously described with respect to the insulating spacers 522. The insulating spacers 822 can be wider to allow for a sufficiently high enough breakdown voltage between the conductive electrodes 834 and subsequently-formed conductive plugs formed within the trenches. In an embodiment, the layer can be deposited to a thickness in a range of approximately 110 nm to approximately 400 nm. Part of the exposed ILD layer 702 along its uppermost surface may be etched when forming the insulating spacers 822.

Portions of the insulating layer 322, the dielectric layer 108, the drift regions 222, the resurf regions 242, and the semiconductor layer 106 are etched within the opening. The bottoms of the trenches 802 are spaced apart from the buried insulating layer 104 and the buried conductive region 102. In an embodiment, patterning can be formed using anisotropic etching. Part of the exposed ILD layer 702 along its uppermost surface may be etched when etching the insulating layer 322, the dielectric layer 108, or any combination thereof. In another embodiment, etching can be continued so that the trenches 802 extend though the buried insulating layer 104 and into the buried conductive region 102. In the illustrated embodiment, the trenches 802 may extend in a range of approximately 25% to 75% of the thickness of the semiconductor layer, and in a particular embodiment, the trenches 802 may extend in a range of approximately 0.3 micron to 3 microns into the semiconductor layer 106. In an embodiment, the width of each of the trenches 802 is in a range of approximately 0.05 micron to 2 microns, and in a particular embodiment, the width of each of the trenches 802 is in a range of approximately 0.1 micron to approximately 1 micron. Dimensions of the trenches 802 may be the same or different from each other.

A conductive layer is formed over the ILD layer 702 and within the trenches 802, and, in a particular embodiment, the conductive layer substantially completely fills the trenches 802. The conductive layer can include one or more films, each of which includes a metal-containing or semiconductor-containing material. In an embodiment, the conductive layer can include a relatively thin film of heavily doped semiconductor material, such as amorphous silicon or polysilicon, and a bulk film including a refractory metal. In a particular embodiment, the conductive layer includes a plurality of films, such as heavily doped semiconductor film, an adhesion film, a barrier film, and a conductive fill material. In a particular embodiment, the adhesion film can include a refractory metal, such as titanium, tantalum, tungsten, or the like; the barrier film can include a refractory metal nitride, such as titanium nitride, tantalum nitride, tungsten nitride, or the like, or a refractory metal-semiconductor-nitride, such as TaSiN; and the conductive fill material can include tungsten or tungsten silicide. In a more particular embodiment, the conductive layer can include Ti/TiN/W. The selection of the number of films and composition(s) of those film(s) depends on electrical performance, the temperature of a subsequent heat cycle, another criterion, or any combination thereof. Refractory metals and refractory metal-containing compounds can withstand high temperatures (e.g., melting points of the refractory metals can be at least 1400° C.), may be conformally deposited, and have a lower bulk resistivity than heavily doped n-type silicon. After reading this specification, skilled artisans will be able to determine the composition of the conductive layer to meet their needs or desires for a particular application.

Figure 15:
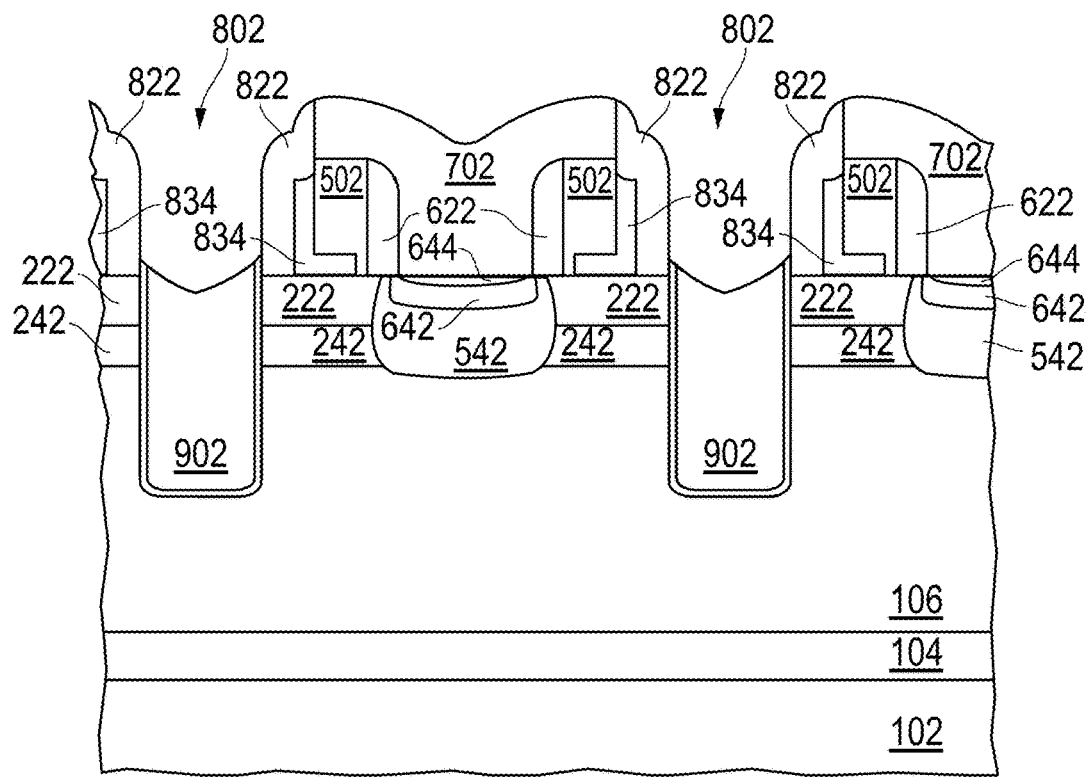
FIG. 15 includes an illustration of a cross-sectional view of the workpiece of FIG. 14 after forming conductive structures within the trenches.

The portion of the conductive layer that is disposed over the ILD layer 702 is removed. The removal can be performed using a chemical-mechanical polishing or blanket etching technique. An etch or other removal operation is performed to recess the conductive layer further into the trenches 802 to form vertical conductive structures 902, as illustrated in FIG. 15. The vertical conductive structures 902 are the sinker portion of the drain region. The uppermost elevations of the vertical conductive structures 902 may lie at least at the lowest elevations of the drift regions 222 immediately adjacent to the trenches 802. As the uppermost elevations of the vertical conductive structures 902 extend to elevations higher than the drift regions 222, parasitic capacitive coupling to the conductive electrodes 834 becomes greater. In a particular embodiment, the vertical conductive structures 902 may extend to an elevation higher than the primary surface 105. In another particular embodiment, the vertical conductive structures 902 may extend to an elevation no higher than the primary surface 105. None of the vertical conductive structures 902 are covered by the conductive electrodes 834. From a top view, the vertical conductive structures 902 are between immediately adjacent pairs of conductive electrode members 734 of the conductive electrodes 834.

The vertical conductive structures 902 are examples of vertical conductive regions. In another embodiment, a different type of vertical conductive region may be used. For example the vertical conductive regions may be formed by doping portions of the drift region 222 and the semiconductor layer 106. The doped regions may be formed using different implants at different energies. When the vertical conductive structures are replaced by the doped regions, the heavily doped regions may be formed earlier in the process flow.

Figure 16:
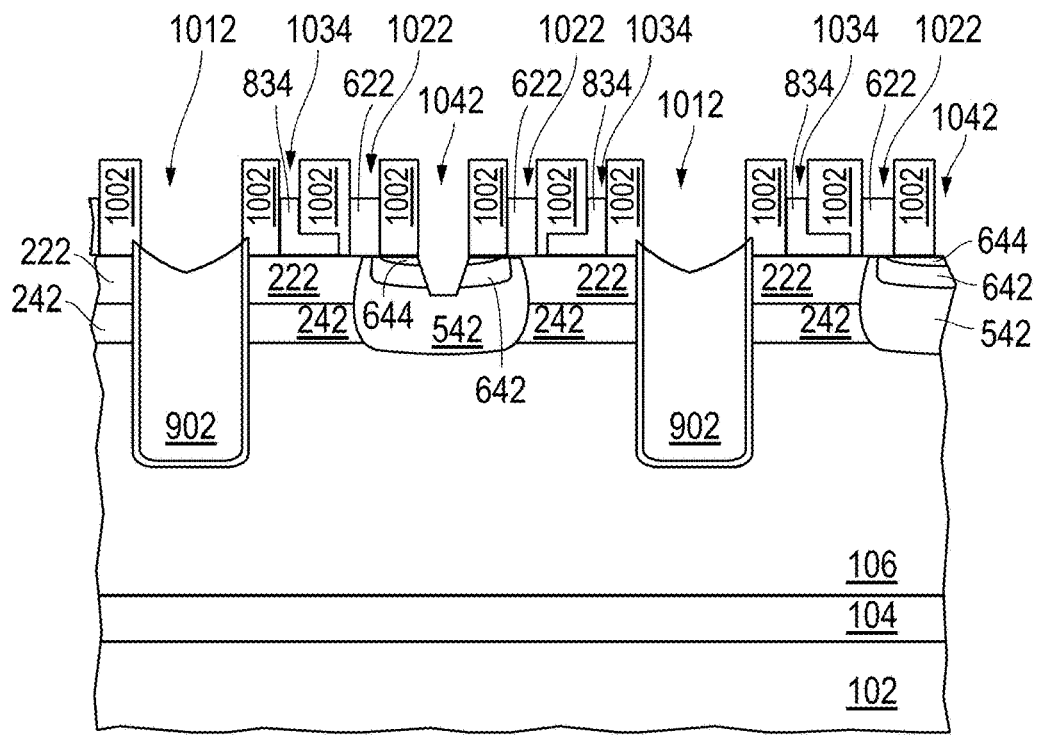
FIG. 16 includes an illustration of a cross-sectional view of the workpiece of FIG. 15 after defining contact openings to the conductive electrodes, the gate electrodes, and source and body contact regions.

FIG. 16 includes an illustration of the workpiece that includes a patterned composite insulating layer 1002 that defines contact openings as illustrated in FIG. 16. An ILD layer is formed over the exposed surface of the workpiece. The ILD layer substantially completely fills remaining portions of the trenches 802. The ILD layer can include any of the materials, films, and thicknesses as previously described with respect to the ILD layer 702. The ILD layer can have the same or different materials, films, and thicknesses as compared to the ILD layer 702. The composite insulating layer 1002 includes portions of the uppermost ILD layer, ILD layers 702, the insulating layer 502, insulating spacers 522 and 822, the insulating layer 624, and portions of the gate dielectric layer 602 not covered by the gate electrodes 622. The composite insulating layer 1002 can be planarized if needed or desired.

The composite insulating layer 1002 is patterned to define contact openings that can be formed using one or more masking layers. The number of masking layer may depend on the particular application. The embodiment described below is exemplary and not intended to limit the scope of the present invention.

A masking layer may not be needed for the contact openings 1022 and 1034. When the composite insulating layer 1002 is planarized, a non-selective polishing or etchback process can be used until portions of the gate electrodes 622 and conductive electrodes 834 are exposed. A selective etch can be performed to recess the gate electrodes 622 and conductive electrodes 834 to define the contact openings 1022 and 1034. This particular process allows for contact openings to be formed without needing a separate masking operation.

A masking layer (not illustrated) is formed over the workpiece and includes openings overlying the vertical conductive structures 902. Exposed portions of the composite insulating layer 1002 are etched to define the contact openings 1012 to the vertical conductive structures 902. The patterned masking layer can be removed at this time. Contact opening 1042 allows for a source/body contacts to be made for the transistor structures. Another masking layer (not illustrated) is formed over the workpiece, and exposed portions of the composite insulating layer 1002 are etched. Etching is continued to etch through the source regions 644 and expose a portion of the body regions 642 along the bottom of the contact opening 1042. The bottom of the contact opening 1042 can be doped to form the heavily doped region 1142 (illustrated in FIG. 17), which allows an ohmic contact to be formed to the body regions 642. The heavily doped region 1142 has the same conductivity type as body regions 642 and a dopant concentration of at least $1 \times 10^{19}$ atoms/cm$^3$. The masking layer can be removed. The workpiece may be annealed to activate the dopants introduced into the workpiece during the contact opening process sequence.

Figure 17:
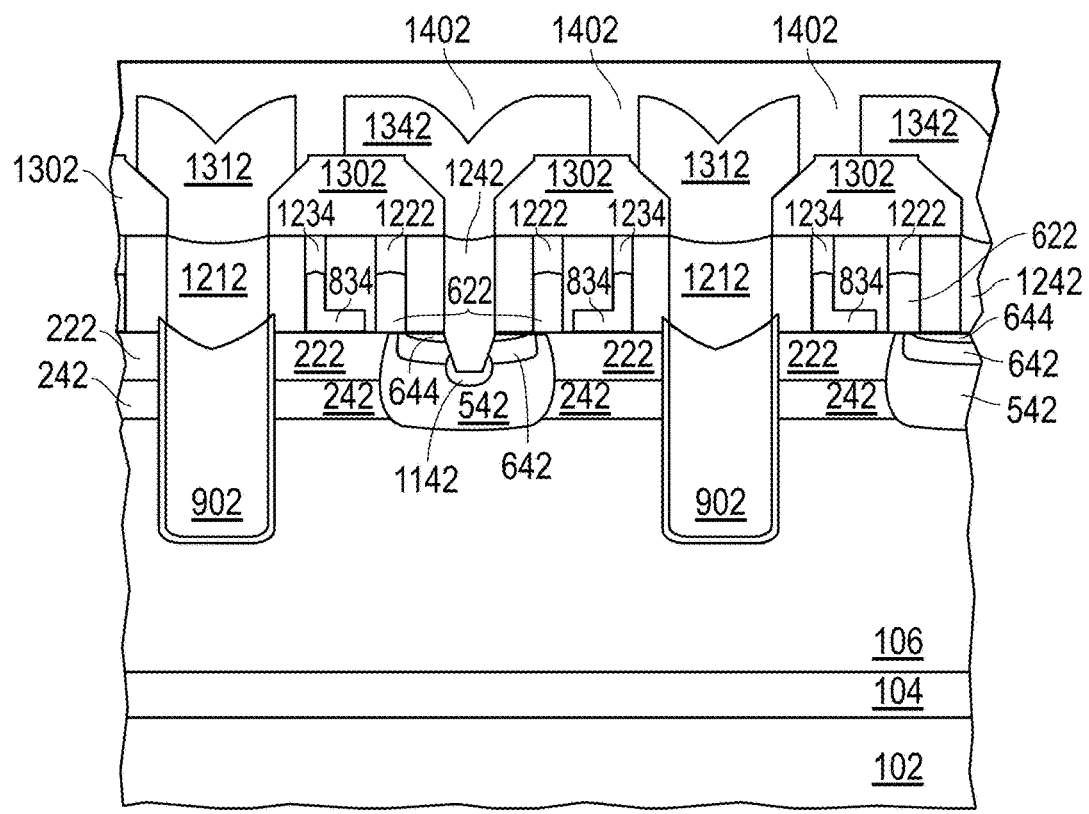
FIG. 17 includes an illustration of a cross-sectional view of the workpiece of FIG. 16 after forming a substantially completed electronic device.

FIG. 17 includes an illustration of the workpiece after forming conductive plugs, a first level of interconnects, and a passivation layer. Conductive plugs 1212 are electrically connected to the vertical conductive structures 902, conductive plugs 1222 are electrically connected to the gate electrodes 622, conductive plugs 1234 are electrically connected to the conductive electrodes 834, and conductive plugs 1242 are electrically connected to the source regions 644 and the heavily doped regions 1142. In an embodiment, none of conductive plugs within the composite insulating layer 1002 directly contacts the drift regions 222 or the conductive electrode members 534 of the conductive electrodes 834.

In an embodiment, the conductive plugs 1212, 1222, 1242, and 1234 can be formed using a plurality of films. In an embodiment, a layer including a refractory metal, such as Ti, Ta, W, Co, Pt, or the like, can be deposited over the workpiece and within the contact openings 1012, 1022, 1034, and 1042. If needed or desired, a layer including a metal nitride layer can be deposited over the layer including the refractory metal. The workpiece can be annealed so that portions of the layer including the refractory metal are selectively reacted with exposed silicon, such as substantially monocrystalline or polycrystalline silicon, to form a metal silicide. Thus, portions of the gate electrodes 622, conductive electrodes 834, source regions 644, body regions 642, and heavily doped regions 1142 may react with the metal within the layer that includes the refractory metal to form a metal silicide. Portions of the layer including the refractory metal that contact an insulating layer do not react. A metal nitride layer may be formed to further fill a part, but not the remainder of the openings. The metal nitride layer can act as a barrier layer. A layer of a conductive material fills the remainder of the contact openings 1012, 1022, 1034, and 1042. Portions of the layer including the refractory metal, the metal nitride layer and the conductive material that overlies the composite insulating layer 1002 are removed to form the conductive plugs 1212, 1222, 1234, and 1242.

An ILD layer 1302 is formed over the workpiece and can include any of the compositions as previously described with respect to the ILD layer 702. The ILD layer 1302 can have substantially the same composition or a different composition as compared to the ILD layer 702. The ILD layer 1302 is patterned to define interconnect openings, and interconnects 1312 and 1342 are formed within the interconnect openings. Interconnects 1312 contact the conductive plugs 1212 and provide connections to the drains of the transistor structures, and interconnects 1342 contact the conductive plugs 1242 and provide connections to the sources of the transistor structures. Although not illustrated, interconnects 1342 are also electrically connected to the conductive electrodes 834. Other interconnects (not illustrated) contact the conductive plugs 1222 and provide connections to the gates of the transistor structures. A passivation layer 1402 is formed over the interconnects 1312 and 1342 and other interconnects that are not illustrated in FIG. 17.

Although not illustrated, additional or fewer layers or features may be used as needed or desired to form the electronic device. Field isolation regions are not illustrated but may be used to help electrically isolate portions of the power transistor. In another embodiment, more insulating and interconnect levels may be used. For example, the interconnects 1342 (for the sources) and interconnects for the gates may be at one level, and other interconnects at another interconnect level (not illustrated) may be connected to the interconnects 1312 (for the drains). After reading this specification, skilled artisans will be able to determine layers and features for their particular application.

Referring to the transistor structures as illustrated in FIG. 17, the vertical conductive structures 902 extend beyond the drift regions 222 and at least as deep as the elevation for the peak concentration of the resurf region 242. When $BV_{DS}$ for the transistor structures is exceeded, the location for the highest impact ionization is below the drift regions 222. Thus, the semiconductor material within the drift regions 222 is not damaged when breakdown occurs.

Many different aspects and embodiments are possible. Some of those aspects and embodiments are described below. After reading this specification, skilled artisans will appreciate that those aspects and embodiments are only illustrative and do not limit the scope of the present invention. Exemplary embodiments may be in accordance with any one or more of the ones as listed below.

Embodiment 1

An electronic device comprising a semiconductor layer having a primary surface; a drift region adjacent to the primary surface; a drain region adjacent to the drift region and extending deeper into the semiconductor layer as compared to the drift region; a resurf region spaced apart from the primary surface; an insulating layer overlying the drain region; and a contact extending through the insulating layer to the drain region.

Embodiment 2

The electronic device of Embodiment 1, wherein the drift region and the drain region have a first conductivity type, and the resurf region has a second conductivity type opposite the first conductivity type.

Embodiment 3

The electronic device of Embodiment 1, further comprising a source region adjacent to the primary surface; and a channel region disposed between the source region and the drift region, wherein the resurf region underlies the channel region and has a peak concentration depth, and the drain region includes a sinker portion that extends to a depth at least as deep as the peak concentration depth of the resurf region.

Embodiment 4

The electronic device of Embodiment 3, wherein the resurf region extends under a portion of the drift region.

Embodiment 5

The electronic device of Embodiment 3, wherein the sinker portion includes a doped region having an opposite conductivity type as compared to resurf region.

Embodiment 6

The electronic device of Embodiment 3, further comprising a first trench isolation structure that abuts the sinker portion of the drain region and extends to a depth deeper than the sinker portion.

Embodiment 7

The electronic device of Embodiment 6, further comprising a second trench isolation structure and a gate electrode, wherein the second trench isolation structure extends into and has a depth less than the drift region, is disposed between the channel region and the drain region, and a portion of the drift region is disposed between the channel region and the second trench isolation structure; and the gate electrode overlies the channel region and portions of the drift region and the second trench isolation structure.

Embodiment 8

The electronic device of Embodiment 1, further comprising a buried conductive region spaced apart from the resurf region, wherein a sinker portion of the drain region extends to the buried conductive region.

Embodiment 9

The electronic device of Embodiment 1, further comprising a buried conductive region spaced apart from and underlying the resurf region, wherein the sinker portion is spaced apart from the buried conductive region.

Embodiment 10

The electronic device of Embodiment 1, wherein a transistor includes a portion of the semiconductor layer, the drift region, the drain region, and the resurf region, wherein the transistor has a bulk breakdown voltage of at least 70 V.

Embodiment 11

The electronic device of Embodiment 1, wherein during a bulk breakdown, a location of highest impact ionization is located outside of the drift region.

Embodiment 12

A process of forming an electronic device comprising providing a workpiece including a semiconductor layer having a primary surface; forming a drift region along the primary surface; forming a resurf region within the semiconductor layer, wherein the resurf region is spaced apart from the primary surface; forming a drain region adjacent to the drift region and extending deeper into the semiconductor layer as compared to the drift region; forming a patterned insulating layer defining a contact opening to the drain region; and forming a contact in the contact opening to the drain region.

Embodiment 13

The process of Embodiment 12, wherein in a finished device, the resurf region extends under a portion of the drift region and is spaced apart from the drain region.

Embodiment 14

The process of Embodiment 12, further comprising forming a source region along the primary surface, wherein a channel region is disposed between the source region and the drift region; the resurf region underlies the channel region and has a peak concentration depth; and the drain region includes a sinker portion that extends to a depth at least as deep as the peak concentration depth of the resurf region.

Embodiment 15

The process of Embodiment 14, further comprising forming a buried conductive region before forming the semiconductor layer, wherein forming the drain region is performed such that the sinker portion extends to the buried conductive region.

Embodiment 16

The process of Embodiment 14, further comprising forming a buried conductive region before forming the semiconductor layer, wherein forming the drain region is performed such that the sinker portion is spaced apart from the buried conductive region.

Embodiment 17

The process of Embodiment 14, further comprising forming a first trench isolation structure that abuts the sinker portion of the drain region and extends to a depth deeper than the sinker portion.

Embodiment 18

The process of Embodiment 17, further comprising forming a second trench isolation structure extending into the drift region and having a depth less than the drift region; and forming a gate electrode over the channel region and portions of the drift region and second trench isolation structure.

Embodiment 19

The process of Embodiment 12, wherein a transistor includes a portion of the semiconductor layer, the drift region, the drain region, the resurf region, and a source region, wherein the transistor has a bulk breakdown voltage of at least 70 V.

Embodiment 20

The process of Embodiment 12, further comprising forming a shield electrode over the drift region.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. An electronic device comprising a transistor structure, wherein the transistor structure comprises:
   a buried conductive region having a first conductivity type;
   a semiconductor layer overlying the buried conductive region, the semiconductor layer having a primary surface and a second conductivity type opposite the first conductivity type;
   a drift region adjacent to the primary surface;
   a sinker region contacting the drift region and extending deeper into the semiconductor layer as compared to the drift region;
   a drain contact region spaced apart from the drift region;
   a resurf region having the second conductivity type, wherein the resurf region is spaced apart from the primary surface, is spaced apart from the buried conductive region by a portion of the semiconductor layer, and extends under the drift region, wherein, within the transistor structure, none of the resurf region contacts the buried conductive region; and
   a first trench isolation structure that extends from the primary surface to a depth in a range of 0.2 micron to 0.9 micron, wherein the first trench isolation structure overlies the resurf region.

2. The electronic device of claim 1, further comprising a resurf extension region contacting the resurf region, wherein:
   the drift region has a first side and a second side opposite the first side,
   the sinker region is along the first side of the drift region and is spaced apart from the second side of the drift region, and
   the resurf extension region is closer to the second side of the drift region than to the first side of the drift region.

3. The electronic device of claim 2, further comprising a source region adjacent to the primary surface and overlying the resurf extension region.

4. The electronic device of claim 3, further comprising a contact and a body contact region within the resurf extension region, wherein the contact contacts the body contact region and the source region.

5. The electronic device of claim 1, further comprising:
   a source region adjacent to the primary surface; and
   a channel region disposed between the source region and the drift region,
   wherein:
      the resurf region underlies the channel region and has a peak concentration depth, and
      the sinker region extends to a depth at least as deep as the peak concentration depth of the resurf region.

6. The electronic device of claim 5, further comprising a gate electrode overlying the channel region and portions of the drift region and the first trench isolation structure.

7. The electronic device of claim 1, further comprising:
   an insulating layer overlying at least parts of the drift region and the sinker region; and
   a contact extending through the insulating layer to the drain contact region.

8. The electronic device of claim 1, wherein the buried conductive region underlies and contacts the sinker region.

9. The electronic device of claim 8, further comprising a second trench isolation structure extending to a depth deeper than the buried conductive region.

10. The electronic device of claim 1, wherein the transistor structure has a bulk breakdown voltage of at least 70 V.

11. The electronic device of claim 1, wherein the transistor structure is configured such that, during a bulk breakdown, a location of highest impact ionization is located outside of the drift region.

12. The electronic device of claim 1, further comprising:
a resurf extension region contacting the resurf region, wherein:
the drift region has a first side and a second side opposite the first side,
the sinker region is along the first side of the drift region and is spaced apart from the second side of the drift region, and
the resurf extension region is closer to the second side of the drift region than to the first side of the drift region;
a source region adjacent to the primary surface;
a channel region disposed between the source region and the drift region;
a gate electrode overlying at least a portion of each of the channel region, the drift region, and the first trench isolation structure; and
a second trench isolation structure that abuts the sinker region and extends to a depth deeper than the buried conductive region,
wherein the transistor structure has a bulk breakdown voltage of at least 70 V.

13. An electronic device comprising a transistor structure, wherein the transistor structure comprises:
a buried conductive region;
a semiconductor layer overlying the buried conductive region and having a primary surface;
a drift region adjacent to the primary surface;
a sinker region contacting the drift region and extending deeper into the semiconductor layer as compared to the drift region;
a resurf region spaced apart from the primary surface;
a resurf extension region adjacent to the resurf region;
a body contact region within the resurf extension region, wherein of the body contact region is electrically connected to the resurf region via the resurf extension region; and
a first trench isolation structure that extends from the primary surface to a depth in a range of 0.2 micron to 0.9 micron, wherein the first trench isolation structure overlies the resurf region,
wherein the transistor structure is configured such that a bulk breakdown occurs between the sinker portion and the resurf region.

14. The electronic device of claim 13, further comprising:
a source region along the primary surface of the semiconductor layer and overlying the resurf extension region; and
a contact contacting the source region and the body contact region.

15. The electronic device of claim 13, wherein the semiconductor layer includes a portion between the resurf region and the buried conductive region, such that the resurf region does not contact the buried conductive layer within the transistor structure.

16. The electronic device of claim 15, wherein the bulk breakdown voltage is at least 70 V.

17. The electronic device of claim 16, further comprising a second trench isolation structure extending to a depth deeper than the buried conductive region.

18. The electronic device of claim 15, further comprising:
a source region adjacent to the primary surface;
a channel region disposed between the source region and the drift region;
a gate electrode overlying at least a portion of each of the source region, the channel region, the drift region, and the first trench isolation structure; and
a drain contact region within the sinker region and spaced apart from the drift region.

* * * * *